(12) United States Patent
Harjung et al.

(10) Patent No.: US 11,855,494 B2
(45) Date of Patent: Dec. 26, 2023

(54) FILTER CIRCUIT ON AN ELECTRIC MOTOR

(71) Applicant: Andreas Stihl AG & Co. KG, Waiblingen (DE)

(72) Inventors: Philipp Harjung, Schwaikheim (DE); Martin Fuerst, Ingolstadt (DE); Alexander Ruehle, Remshalden (DE)

(73) Assignee: Andreas Stihl AG & Co. KG, Waiblingen (DE)

( * ) Notice: Subject to any disclaimer, the term of this patent is extended or adjusted under 35 U.S.C. 154(b) by 37 days.

(21) Appl. No.: 17/508,687

(22) Filed: Oct. 22, 2021

(65) Prior Publication Data

US 2022/0140701 A1     May 5, 2022

(30) Foreign Application Priority Data

Oct. 29, 2020    (EP) .................................. 20 204 647

(51) Int. Cl.
    *H02K 11/02*        (2016.01)
    *H02K 11/026*      (2016.01)
    (Continued)

(52) U.S. Cl.
    CPC ........... *H02K 11/026* (2013.01); *H02K 17/30* (2013.01); *H03H 1/0007* (2013.01); *H05K 2201/0715* (2013.01)

(58) Field of Classification Search
    CPC .... H02K 11/026; H02K 17/30; H02K 11/028; H02K 11/0094; H05K 1/0231;
    (Continued)

(56) References Cited

U.S. PATENT DOCUMENTS

| | | | |
|---|---|---|---|
| 5,872,411 A * | 2/1999 | Nakata | H02K 5/225 |
| | | | 310/67 R |
| 2007/0173086 A1 | 7/2007 | Schmiederer et al. | |

(Continued)

FOREIGN PATENT DOCUMENTS

| | | | | |
|---|---|---|---|---|
| DE | 10 2004 056 041 A1 | 5/2006 | | |
| DE | 102004057094 A1 * | 6/2006 | ............... | H03H 5/12 |

(Continued)

OTHER PUBLICATIONS

DE-102006044304 machine translation Feb. 25, 2023.*

(Continued)

*Primary Examiner* — Leda T Pham
(74) *Attorney, Agent, or Firm* — Walter Ottesen, P.A.

(57) ABSTRACT

The disclosure relates to a filter circuit on an electric motor which has electrical connections at a connection end for connection to a supply voltage (U). The filter circuit consists of at least one capacitor bridge arranged between the connections of the electric motor for radio interference suppression. For increased electromagnetic compatibility (EMC), the filter circuit is arranged on a circuit board and held on the connection end of the electric motor. The circuit board has a capacitor bridge with interference suppression capacitors, which is connected between the electrical connections of the electric motor, wherein an interference suppression capacitor has a longitudinal axis between its electrical connections in the longitudinal direction. The interference suppression capacitors are arranged on the circuit board with their longitudinal axes aligned in different spatial directions.

16 Claims, 8 Drawing Sheets

(51) Int. Cl.
*H02K 17/30* (2006.01)
*H03H 1/00* (2006.01)

(58) Field of Classification Search
CPC .. H05K 1/0253; H05K 1/0224; H05K 1/0236; H03H 1/0007
See application file for complete search history.

(56) References Cited

U.S. PATENT DOCUMENTS

2011/0043060 A1* 2/2011 Schmiederer ........ H05K 1/0231
310/72
2013/0307380 A1* 11/2013 Zeng .................... H02K 11/026
310/68 R
2019/0358769 A1* 11/2019 Miyazawa .............. B24B 47/12

FOREIGN PATENT DOCUMENTS

DE   10 2006 044 304 A1   3/2008
DE       102006044304 A1 *  3/2008  ........... H02K 11/024

OTHER PUBLICATIONS

DE-102004057094 machine translation Feb. 25, 2023.*
Kinnaird, C. et al, "Addressing EMI challenges for high side switches and motor drivers in body electronics", TI Tech Days, 2020, copyright Texas Instruments Incorporated, 37 pages.

* cited by examiner

FILTER CIRCUIT ON AN ELECTRIC MOTOR

CROSS REFERENCE TO RELATED APPLICATION

This application claims priority of European patent application no. 20 204 647.0, filed Oct. 29, 2020, the entire content of which is incorporated herein by reference.

TECHNICAL FIELD

The disclosure relates to a filter circuit on an electric motor, which has connections for electrical connection to a supply voltage. The electrical connections of the electric motor are provided on a connection end of the electric motor. The filter circuit has at least one capacitor bridge arranged between the electrical connections of the electric motor in order to achieve electrical interference suppression.

BACKGROUND

In practice, it has been repeatedly shown that, particularly in certain load states of the electric motor, the electromagnetic interference radiation which occurs leads to a considerable electromagnetic disturbance in the environment. Battery-operated tools can be used as mobile devices in many locations, whereby the interference sources can occur in different places and are therefore difficult to localize.

SUMMARY

It is an object of the invention to improve the radio interference suppression in an electric motor, and thereby achieve improved electromagnetic compatibility (EMC) of tools driven by an electric motor, with a low level of complexity in terms of the circuitry.

The aforementioned object can, for example, be achieved in that a capacitor bridge comprising at least two interference suppression capacitors is provided between the electrical connections of the electric motor, which capacitor bridge is placed on a circuit board of the filter circuit, wherein the filter circuit is arranged on the connection end of the electric motor. The interference suppression capacitors used are configured in such a way that a longitudinal axis extends between the electrical connections of the interference suppression capacitor in its longitudinal direction, wherein the interference suppression capacitors, in particular of one and the same capacitor bridge, are mechanically mounted on the circuit board with their longitudinal axes aligned in different spatial directions.

For a significant increase in the radio interference suppression, not only is a particular electrical arrangement of interference suppression capacitors on an electric motor required, but also a certain mechanical arrangement preferably relative to the electric motor and in particular relative to one another. It has been surprisingly established that, in an arrangement in which a capacitor bridge is arranged between the connections of the electric motor, better radio interference suppression can be achieved if the interference suppression capacitors in particular of one and the same capacitor bridge are aligned in different spatial directions.

According to the disclosure, interference suppression capacitors are used, which form a longitudinal axis between their electrical connections. The arrangement of these interference suppression capacitors should then be realised such that the longitudinal axes of the interference suppression capacitors of at least the same capacitor bridge are aligned differently in the x/y direction in their arrangement plane.

The interference suppression capacitors of a capacitor bridge are mechanically fixed on the circuit board in such a way that they are aligned with their longitudinal axes in different spatial directions. A significantly increased electromagnetic compatibility is thus achieved.

In an embodiment, the capacitor bridge forms a conductor branch in which at least two interference suppression capacitors are electrically connected in series, one after another.

In an embodiment, at least two capacitor bridges are provided, wherein the conductor branches of the capacitor bridge lie electrically parallel to one another. Further improvement of the EMC compatibility is achieved as a result of this arrangement.

An advantageous arrangement of the interference suppression capacitors of a plurality of capacitor bridges can be achieved if an interference suppression capacitor of one conductor branch and an interference suppression capacitor of the other conductor branch are mechanically held on the circuit board in such a way that their longitudinal axes lie parallel to one another.

In an embodiment, the mechanical mounting of the interference suppression capacitors of the capacitor bridge on the circuit board is provided in such a way that they lie on a common, virtual mounting circle. In this case, the arrangement of the interference suppression capacitors is expediently selected such that the longitudinal axis of an interference suppression capacitor forms a tangent to the mounting circle. An arrangement of the longitudinal axis of an interference suppression capacitor at an approximate tangent to the mounting circle can be sufficient to achieve the intended effect.

The virtual mounting circle is selected in particular such that it extends around the rotation axis of the rotor of the electric motor. The rotation axis of the electric motor lies in a central opening of the circuit board. In this case, the arrangement of the interference suppression capacitors is selected such that they are arranged along the edge or the edge region of the central opening of the circuit board. The interference suppression capacitors at the edge of the central opening therefore lie in local proximity to the collector of a direct current motor, whereby good electromagnetic interference suppression is possible.

Good interference suppression is achieved if the interference suppression capacitors and the capacitor bridges are arranged on the circuit board at equal spatial distances in the circumferential direction of the mounting circle.

All interference suppression capacitors of a capacitor bridge expediently have the same electrical value. In particular, it is advantageous to build all interference suppression capacitors of the capacitor bridges, in particular all capacitors of the filter circuit, such that they are the same size.

For good electromagnetic interference suppression, provision is furthermore made to add at least one choke to the filter circuit. Therefore, a choke can be arranged between the supply voltage and the electric motor in one or both electrical supply lines, wherein the capacitor bridge is electrically connected between the choke and the connection of the electric motor. Rod core chokes are advantageously used as the chokes. The chokes are mechanically fixed on the circuit board of the filter circuit and electrically integrated in the filter circuit.

In addition to the electrical integration of at least one choke in the filter circuit, the mechanical mounting thereof on the circuit board of the filter circuit is also significant. The choke is therefore advantageously arranged such that its winding axis extending in a longitudinal direction is aligned radially with respect to a virtual mounting circle of the interference suppression capacitors. If a choke is arranged both in the negative path of the supply line and in the positive path of the supply line, their mechanical alignments are therefore selected such that their winding axes are coaxial to one another. In particular, the chokes lie diametrically opposite one another with respect to the central opening of the circuit board or with respect to the virtual mounting circle of the interference suppression capacitors.

In an embodiment, the electric motor is built as a direct current motor and drives a tool which is arranged at one end of a guide tube of a work apparatus. The guide tube preferably consists of an electrically conductive material, wherein the supply voltage is fed to the electric motor from the other end of the guide tube via a power cable installed in the guide tube. For increased EMC compatibility, the electrically conductive guide tube is connected to a potential of the supply voltage. In particular, the guide tube is connected to the potential of the supply voltage at its other, lower end. It has proven expedient to electroconductively connect the guide tube to the negative pole of the supply voltage. Instead of a connection to the negative pole of the supply voltage, it can be advantageous to alternatively establish a connection to the positive pole of the supply voltage.

The supply voltage for the electric motor is provided by control electronics. The control electronics are arranged at the other end of the guide tube, which is opposite the tool. In this case, the power cable guided in the guide tube is electrically shielded by the electrically conductive guide tube itself.

BRIEF DESCRIPTION OF THE DRAWINGS

The invention will now be described with reference to the drawings wherein.

DESCRIPTION OF THE PREFERRED EMBODIMENTS

Figure 1:
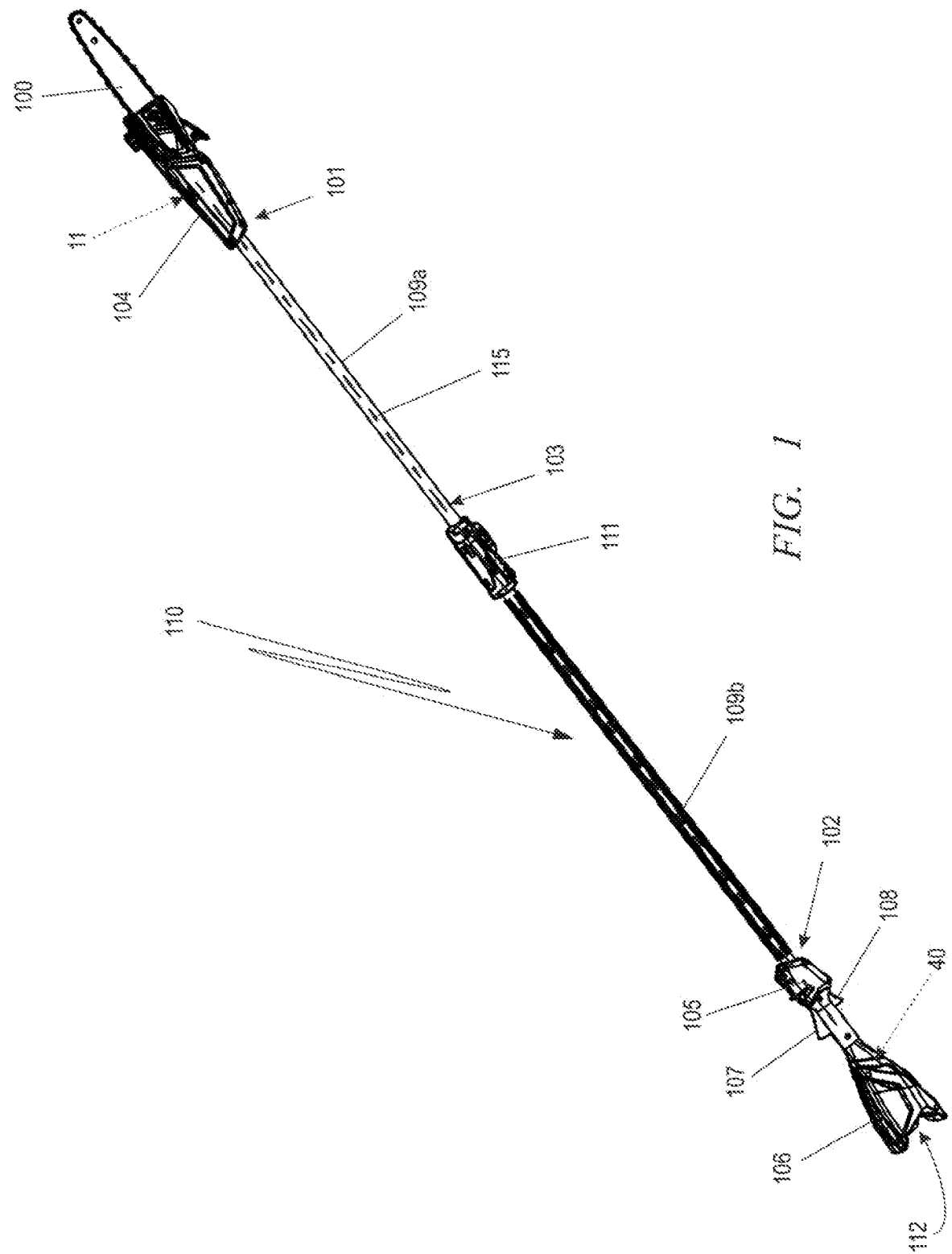
FIG. 1 shows, in a first perspective view, an embodiment of a work apparatus with a guide tube and a tool at one end of the guide tube and a power source at the other.
Figure 2:
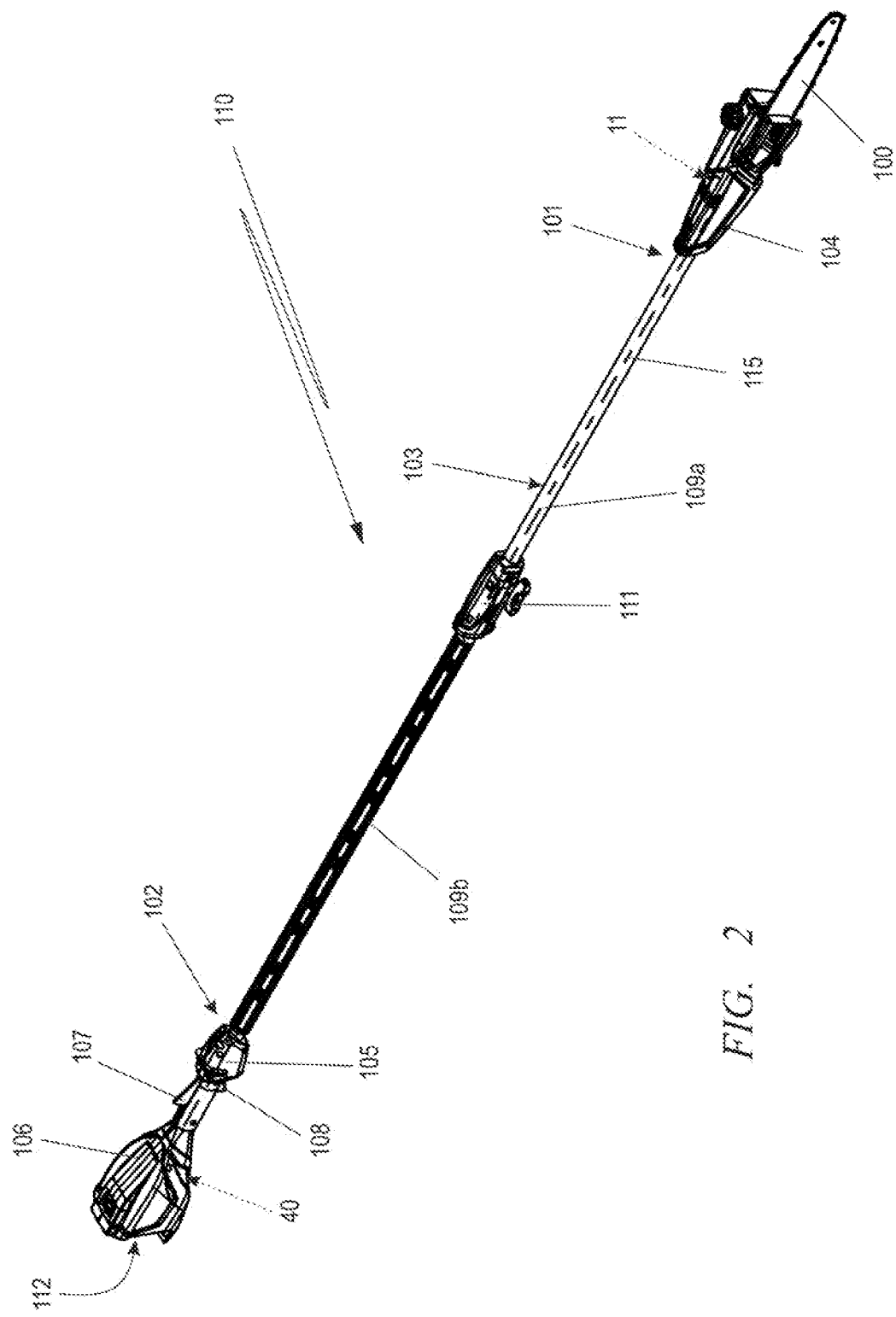
FIG. 2 shows a further perspective view of the work apparatus according to FIG. 1.

By way of example, FIGS. 1 and 2 show a work apparatus 110, which is also referred to as a long shaft apparatus. The work apparatus 110 has a guide tube 103, which supports a tool 100 at one end 101. The tool 100 is driven by an electric motor 11 (not illustrated in more detail), which is held at one end 101 of the guide tube 103 in a drive housing 104. The tool 100 is preferably fastened to the drive housing 104.

The electric motor can be a direct current motor in the form of a commutator motor or an EC motor (for example, a universal motor, a brushless direct current motor or an electronically commutated direct current motor) actuated via an actuating device.

A receptacle housing 106 is held at the other end 102 of the guide tube 103, which receptacle housing has a receiving shaft 112 for receiving a battery or similar power source. It can be expedient to use a fixed mains supply as the power source, which is connected to the receptacle housing 106 and to control electronics 40 received in the receptacle housing 106 via an electric cable. The receptacle housing 106 can be fastened directly on the end 102 of the guide tube 103.

In the embodiment shown, an operating handle 105 with operating elements is provided on the end 102 of the guide tube 103. In the embodiment shown, an operating element, referred to as an operating lever 108 or gas lever, for controlling the electric motor 11 in the drive housing 104 and a locking lever 107 for securing the operating lever 108 are provided as operating elements.

The guide tube 103 shown in FIGS. 1 and 2 can be telescopic. In the embodiment shown, a plug connection is shown, which consists of an upper tube section 109a with the end 101 and the drive housing 104 and the lower tube section 109b with the end 102 and operating handle 105 as well as the receptacle housing 106. The upper tube section 109a can be fixed to the lower tube section 109b or disconnected therefrom via a plug receptacle with a clamping device 111, which plug receptacle is preferably held on the lower tube section 109b.

As indicated in FIGS. 1 and 2, control electronics 40 are provided at the upper end 101 of the guide tube 103 in the drive housing 104 of the electric motor 11 and at the lower end 102 of the guide tube 103 in the receptacle housing 106. The electric motor 11, which is preferably configured as a direct current motor, is electrically connected to the control electronics 40 via a power cable 115. Depending on the position of the operating lever 108 in the operating handle 105, the control electronics 40 control the operation of the electric motor 11 via the power cable 115 to drive the tool 100.

Figure 3:
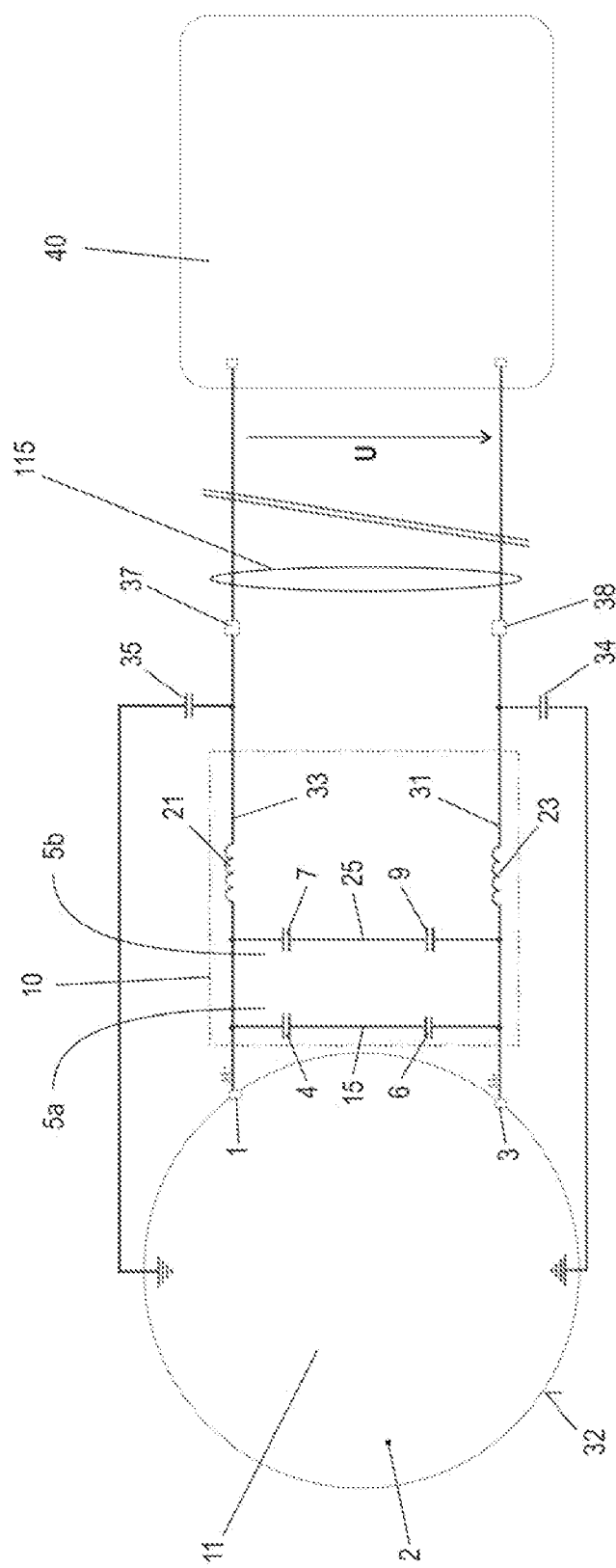
FIG. 3 shows a schematic circuit diagram of an inventive filter circuit.

A schematic circuit diagram of a filter circuit 10 electrically connected to an electric motor 11 is shown in FIG. 3. The power cable 115 between the control electronics 40 and the electric motor 11 consists of a first supply line 33, preferably conducting a positive potential, and a second supply line 31, preferably conducting a negative potential. A supply voltage U for the electric motor 11 is applied between the supply lines 31 and 33. The supply voltage U can be altered by the control electronics 40 depending on the position of the operating lever 108.

In order to prevent electromagnetic interference in the environment during operation of the electric motor 11, the filter circuit 10 is preferably provided directly on the electric motor 11. Depending on the operating states, if a direct current motor is used in particular as the drive motor in the work apparatus 110, brush sparking can occur at the collector, which can cause wireless and wired electromagnetic interferences.

With the inventive enhanced filter circuit 10 according to the illustration in FIG. 3, significant interference suppression of the electric motor 11 and therefore an increase in the electromagnetic compatibility (EMC) can be achieved. To this end, not only is the electrical arrangement of interference suppression capacitors 4, 6, 7, 9 expedient, but moreover also a certain mechanical mounting of the interference suppression capacitors 4, 6, 7, 9 relative to one another.

FIG. 3 shows an inventive filter circuit 10, which is mechanically mounted on the connection end 2 of the electric motor 11. At least one capacitor bridge 5a, 5b is electrically connected between the electrical connections 1 and 3 of the electric motor 11, which capacitor bridge is formed from at least two interference suppression capacitors 4 and 6 or 7 and 9 in each case. In the embodiment shown according to FIG. 3, two capacitor bridges 5a and 5b are provided, wherein each capacitor bridge 5a or 5b forms a conductor branch 15, 25. The conductor branches 15 and 25 lie parallel to one another and are electrically connected between the connections 1 and 3 of the electric motor 11.

Two interference suppression capacitors 4, 6 and 7, 9 are preferably provided in a respective conductor branch 15 and 25 of the capacitor bridge 5a or 5b. The interference suppression capacitors 4, 6 and 7, 9 of a respective conductor branch 15 and 25 of a capacitor bridge 5a or 5b lie in series, one after another, thereby forming a series circuit. It can be advantageous if all interference suppression capacitors 4, 6 and 7, 9 of a capacitor bridge 5a, 5b have the same electrical value. In particular, all interference suppression capacitors 4, 6, 7, 9 of all capacitor bridges 5a, 5b have the same electrical value.

It can furthermore be seen from the schematic circuit diagram according to FIG. 3 that a choke 21 and 23 is respectively connected in the electrical supply lines 31 and 33 between the supply voltage U or the control electronics 40 and the electric motor 11 respectively. The choke 21, 23 is preferably a rod core choke. The electrical connection of the chokes 21 and 23 is provided in such a way that the capacitor bridges 5a and 5b are electrically connected to the line section between the choke 21 and the connection 1 of the electric motor 11 on the one hand and to the line section between the choke 23 and the connection 2 of the electric motor 11 on the other.

The electrical value of the inductance of the chokes 21 and 23 is expediently the same. The electrical value of the inductance is preferably between 1 μH and 4 μH, in particular the electrical value of the inductance is 2 μH.

In an embodiment, a further capacitor 34 is connected between the electrical supply line 31 and an electrically conductive motor housing 32 of the electric motor 11. Accordingly, a further capacitor 35 is connected between the supply line 33 and the electrically conductive motor housing 32. The capacitors 34 and 35 are electrically connected respectively to a line section of the negative supply line 31 and to a line section of the positive supply line 33, which extends between the choke 21 or 23 and the control electronics 40 respectively.

In a particular configuration, all interference suppression capacitors 4, 6, 7, 9, shown in the electric circuit diagram according to FIG. 3 and preferably also the further capacitors 34 and 35 have the same electrical value. An expedient electrical value is between 0.5 nF and 3 nF; it is in particular 1 nF.

In addition to the electrical arrangement of the electrical components of the inventive filter circuit 10, the mechanical mounting of the electrical components is also of significance, in particular also their mechanical mounting in relation to one another.

Figure 4:
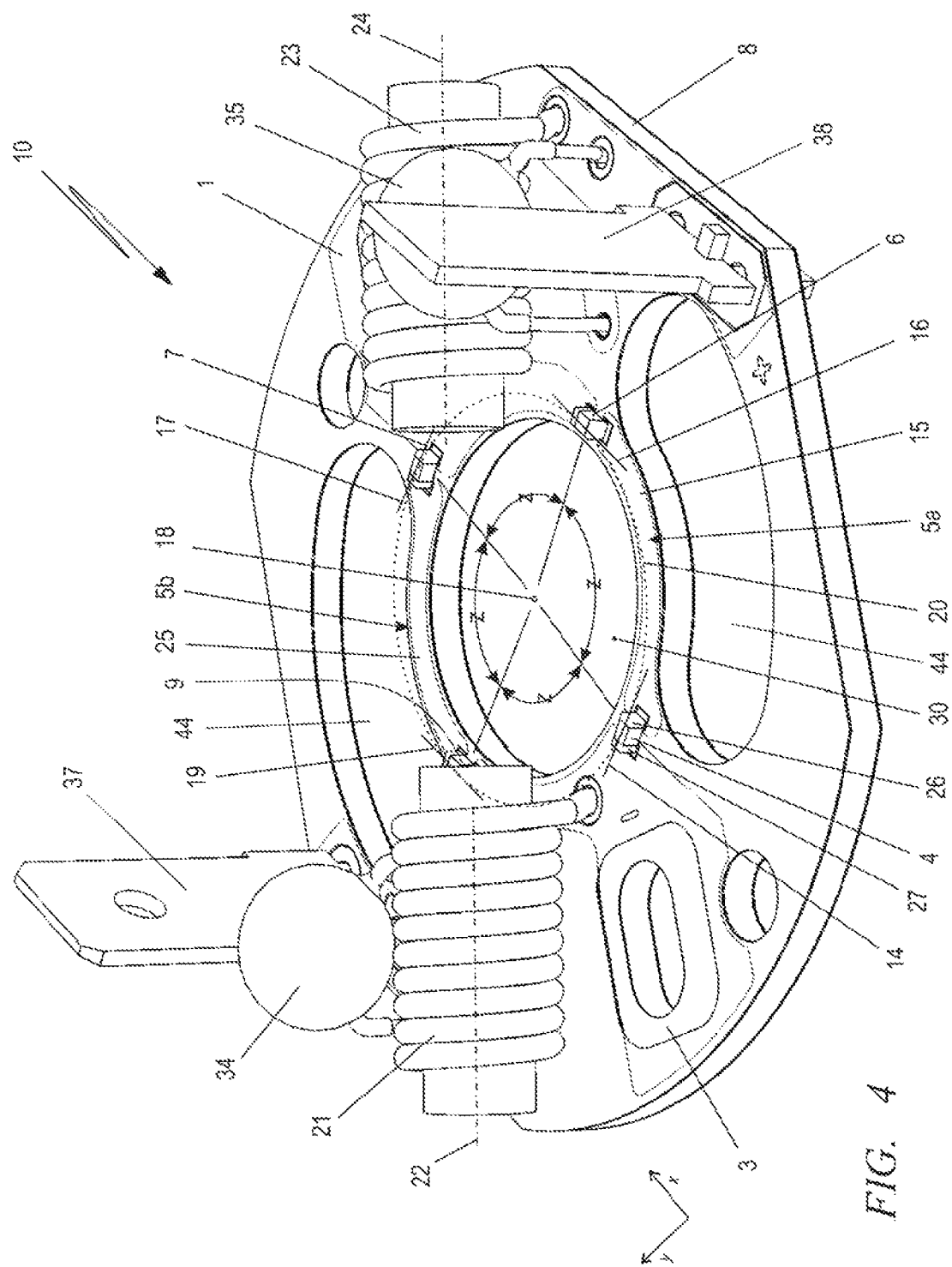
FIG. 4 shows a perspective illustration of the filter circuit arranged on a circuit board.
Figure 5:
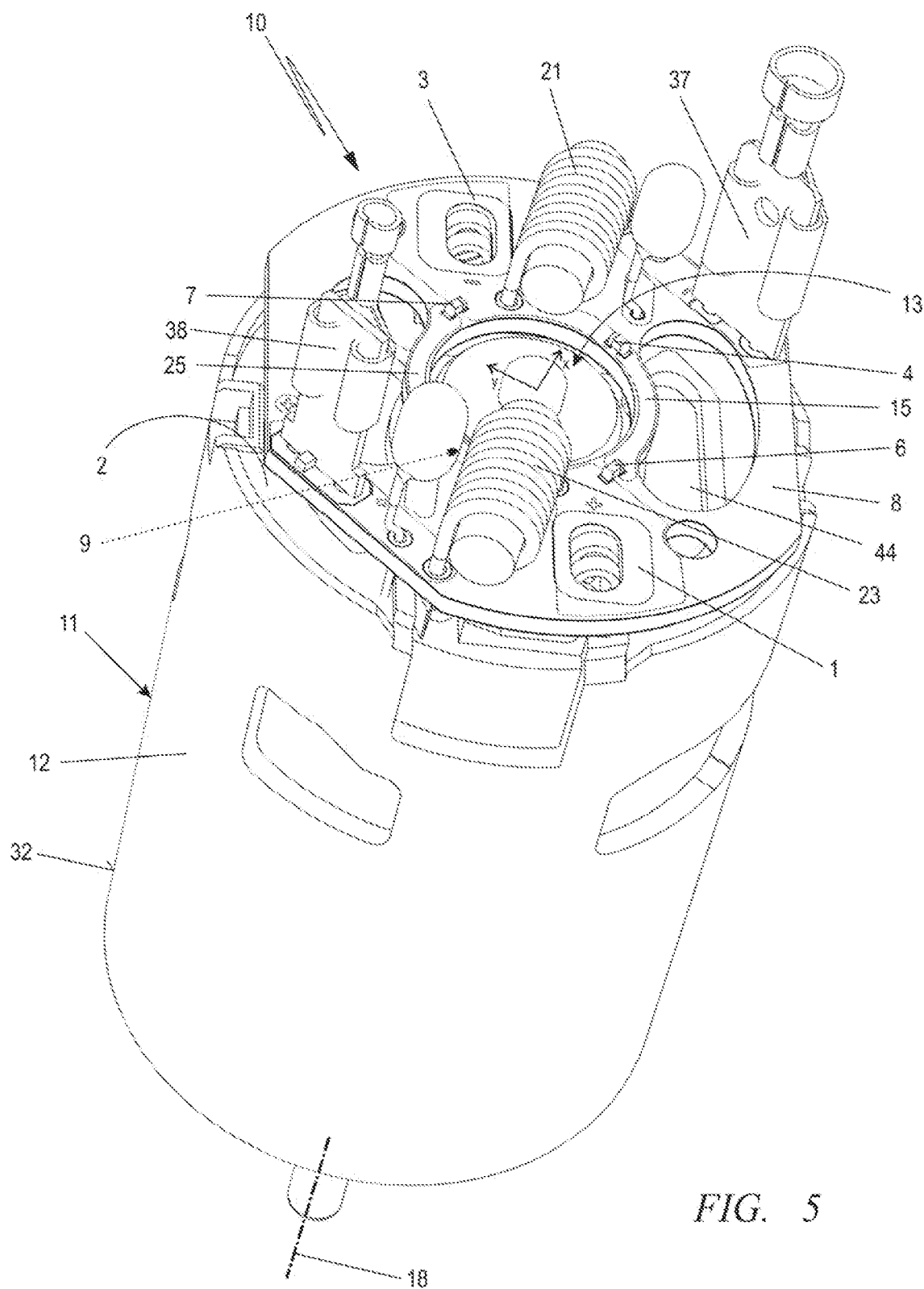
FIG. 5 shows a perspective view of an electric motor with a filter circuit, arranged on its connection end, on a circuit board.

As shown in FIG. 4, the filter circuit 10 is arranged on a circuit board 8. The circuit board 8 is mechanically fixed on the connection end 2 of the electric motor 11, as shown in FIG. 5. In the embodiment shown, the circuit board 8 has an approximately annular basic form with a central opening 30. Traces are formed on the circuit board 8, which, amongst other things, form the conductor branches 15 and 25 of the capacitor bridges 5a and 5b. As shown in FIG. 5, the capacitors 4, 6, 7, 9 of the capacitor bridges 5a and 5b are provided around the central opening 30 on a mounting circle 20. The mounting circle 20 advantageously extends around the rotation axis 18 of the rotor 13 of the electric motor, as shown in particular in FIG. 5.

Circuit board openings 44 are preferably formed between the central opening 30 of the circuit board 8 and the outer edge thereof, which openings serve in each case as a passage for the cooling air flowing axially through the electric motor 11. In the embodiment shown according to FIGS. 4 and 5, two circuit board openings 44 are provided in the circuit board 8, which preferably have a partially annular basic form. The circuit board openings 44 in particular have the same size and—with respect to the rotation axis 18 of the electric motor 11—can preferably be diametrically opposite one another.

The interference suppression capacitors 4, 6, 7, 9 preferably have the same structural form and are in particular configured as SMD components. In particular, each of the interference suppression capacitors 4, 6, 7, 9 has a substantially cuboidal base body with contact caps 26, 27 formed on the end faces of the base body, which contact caps form the electrical connections of the interference suppression capacitor 4, 6, 7, 9. A longitudinal axis 14, 16, 17, 19 is formed between the connections of an interference suppression capacitor 4, 6, 7, 9 in its longitudinal direction, which connections are formed in particular by the electrical contact caps 26 and 27.

In this case, the mechanical mounting of the interference suppression capacitors 4, 6, 7, 9 on the circuit board 8 is provided such that the interference suppression capacitors 4, 6 and 7, 9 of a capacitor bridge 5a and 5b respectively are fixed on the circuit board 8 with their longitudinal axis 14, 16 and 17, 19 orientated in different spatial directions x/y. As shown in FIG. 5, the interference suppression capacitors 4 and 6 in the conductor branch 15 of the capacitor bridge 5a lie with their longitudinal axes 14 and 16 at an angle relative to one another. The interference suppression capacitors 4 and 6 of the capacitor bridge 5a and the interference suppression capacitors 7 and 9 of the capacitor bridge 5b lie in particular approximately in an x/y plane, in particular on a common mounting circle 20. In this case, the arrangement is such that the longitudinal axes 14, 16, 17, 19 of the interference suppression capacitors 4, 6, 7, 9 lie in the manner of a tangent to the mounting circle 20. It is advantageously provided that the interference suppression capacitors of a capacitor bridge 5a, 5b are fixed on the circuit board 8 at a spatial angular distance z in the circumferential direction of the mounting circle 20. Owing to the spatial angular distance z on the mounting circle 20, the longitudinal axes 14, 16 and 17, 19 of the interference suppression capacitors 4, 6 and 7, 9 respectively lie at an angle to one another. In the embodiment shown, the angle between the longitudinal axes 14, 16 and 17, 19 of the interference suppression capacitors 4, 6 and 7, 9 respectively is approximately 90°; an angle between the longitudinal axes of the interference suppression capacitors of a capacitor bridge 5a, 5b is advantageously between 10° and 170°.

In a particular configuration, all interference suppression capacitors 4, 6, 7, 9 of all capacitor bridges 5a, 5b lie at an equal circumferential angular distance z from one another on the mounting circle 20. It can be advantageous to mechanically mount the interference suppression capacitors 4, 6, 7, 9 on the circuit board 8 in such a way that an interference suppression capacitor 4 or 6 of the first conductor branch 15 of the first capacitor bridge 5a and an interference suppression capacitor 7 or 9 of the second conductor branch 25 of the second capacitor bridge 5b lie with their respective longitudinal axes 14 and 17 or 16 and 19 parallel to one another.

The chokes 21 and 23 shown in the supply lines 31 and 33 in the circuit diagram according to FIG. 3 are mechanically held on the circuit board 8 of the filter circuit 10. The chokes 21 and 23 have a respective winding axis 22 and 24 extending in a longitudinal direction. The mechanical mounting of the chokes 21 and 23 on the circuit board 8 is provided such that their winding axes 22 and 24 are aligned radially with respect to the virtual mounting circle 20 of the interference suppression capacitors 4, 6, 7, 9 of the capacitor bridges 5a and 5b. In particular, the mechanical mounting of the chokes 21 and 23 is provided in such a way that they lie with their winding axis 22 and 24 coaxial to one another. With respect to the rotation axis 18 of the mounting circle 20, the winding axes 22 and 24 of the chokes 21 and 23 in particular lie diametrically opposite one another. The winding axes 22 and 24 are also coaxial to one another in the diametrical arrangement.

The circuit board 8 supporting the filter circuit 10 is mechanically fixed on the connection end 2 of the electric motor 11, as shown in FIG. 5. The circuit board 8 is connected to the power cable 115 via plug connections 37 and 38, as is also illustrated in FIG. 3. The connections 1 and 3 of the circuit board 8 serve for the electrical connection to the electric motor 11.

Figure 6:
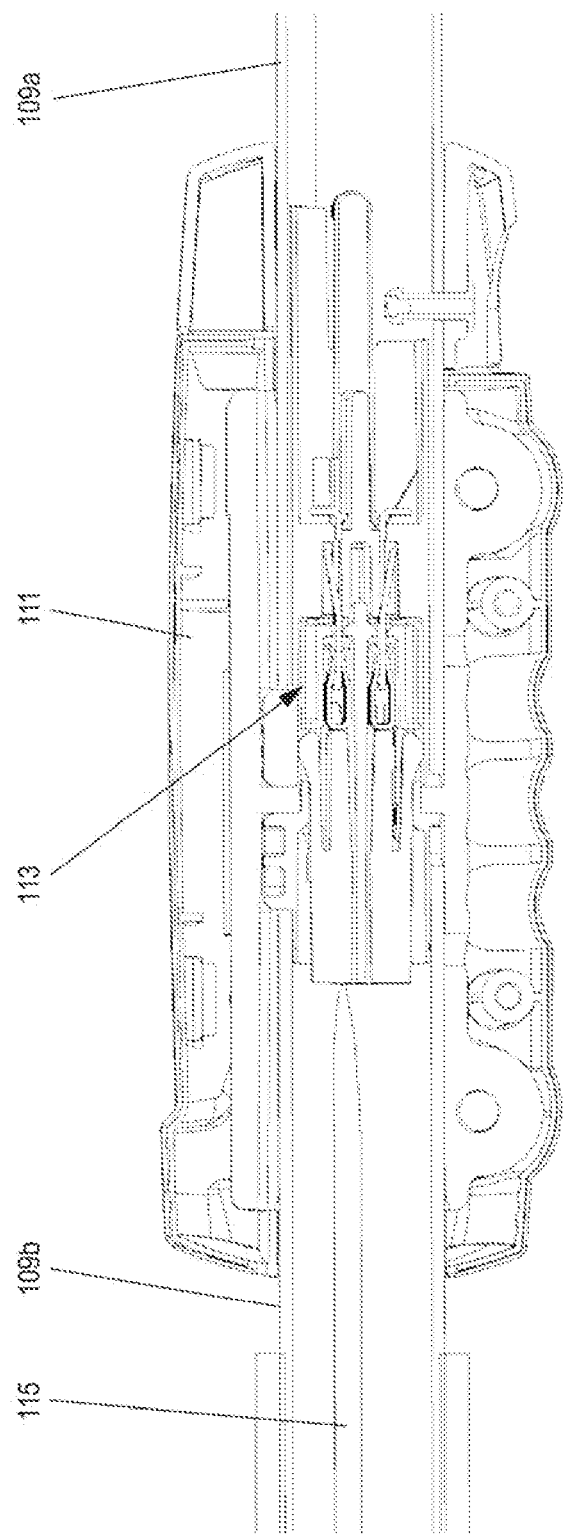
FIG. 6 shows a section through a coupling device between two tube sections and a plug connection for the power cable guided in the tube sections.

A section through a clamping device 111, as shown in FIGS. 1 and 2, is illustrated in a schematic illustration in FIG. 6. In order to enable the disconnection of the guide tube 103 and the power cable 115 guided in the guide tube 103, for example for transporting the work apparatus, a device 113 in the form of a plug/plug receptacle is provided in the clamping device 111, which enables both the disconnection of the power cable 115 by simply pulling the tube sections 109a and 109b apart as well as a simple plugging together.

Figure 7:
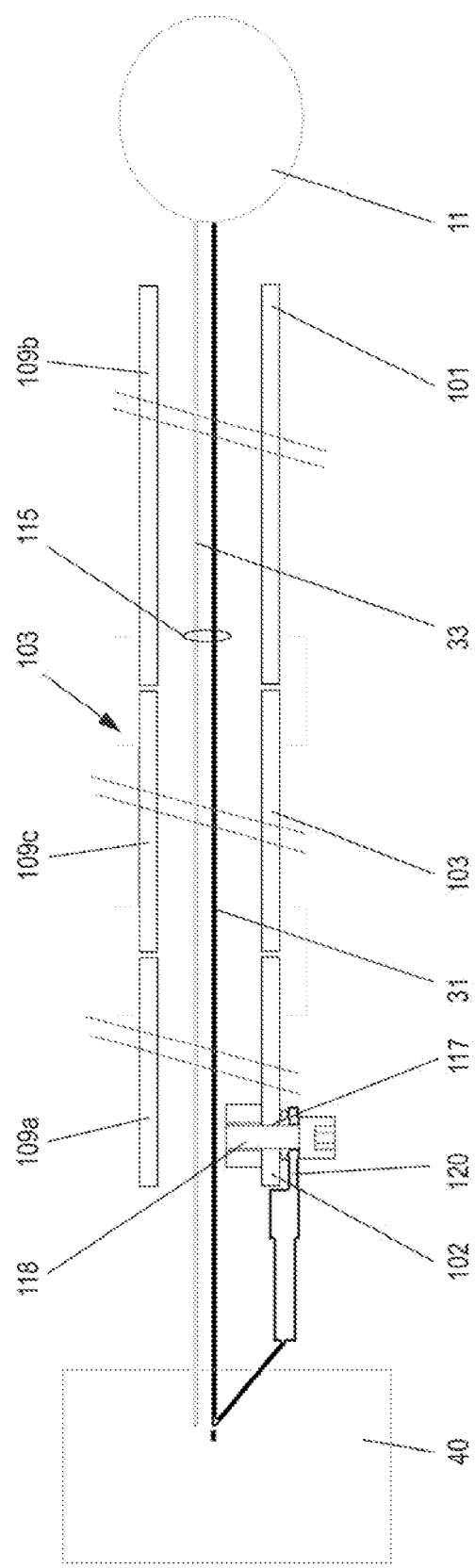
FIG. 7 shows a schematic illustration of the work apparatus shown in FIG. 1 with a guide tube, composed of a plurality of tube sections, in a sectional view; and, FIG. 8 shows a section through the connecting region of the guide tube in the receptacle housing at the lower end of the guide tube.

FIG. 7 shows a schematic representation of a guide tube 103, which is composed of a lower tube section 109a, an upper tube section 109b and an intermediate tube section 109c. The guide tube 103 shown, like the guide tube 103 shown in FIGS. 1 and 2, consists of an electrically conductive material so that a power cable 115 guided in the guide tube 103 is electrically shielded. Environmental pollution caused by electromagnetic radiation can thus be further reduced. In order to ensure an electrical connection between the connected tube sections, the tube sections should preferably be connected to one another via an electrically conductive joint. In particular, the electrical connection of the power cable 115 between two tube sections is established via a releasable electrical plug connection 113, as illustrated in FIG. 6, for example.

The electrically conductive guide tube 103 is advantageously electroconductively connected to a potential of the supply voltage U. Good electromagnetic shielding is thus achieved. As illustrated in FIG. 7 with the aid of an embodiment of an assembled guide tube 103, the guide tube 103 is connected to a potential of the supply voltage U at its lower end 102. The connection to the supply voltage U takes place in the immediate vicinity of the control electronics 40. The electrically conductive guide tube 103 is expediently connected to the negative pole of the supply voltage U.

Figure 8:
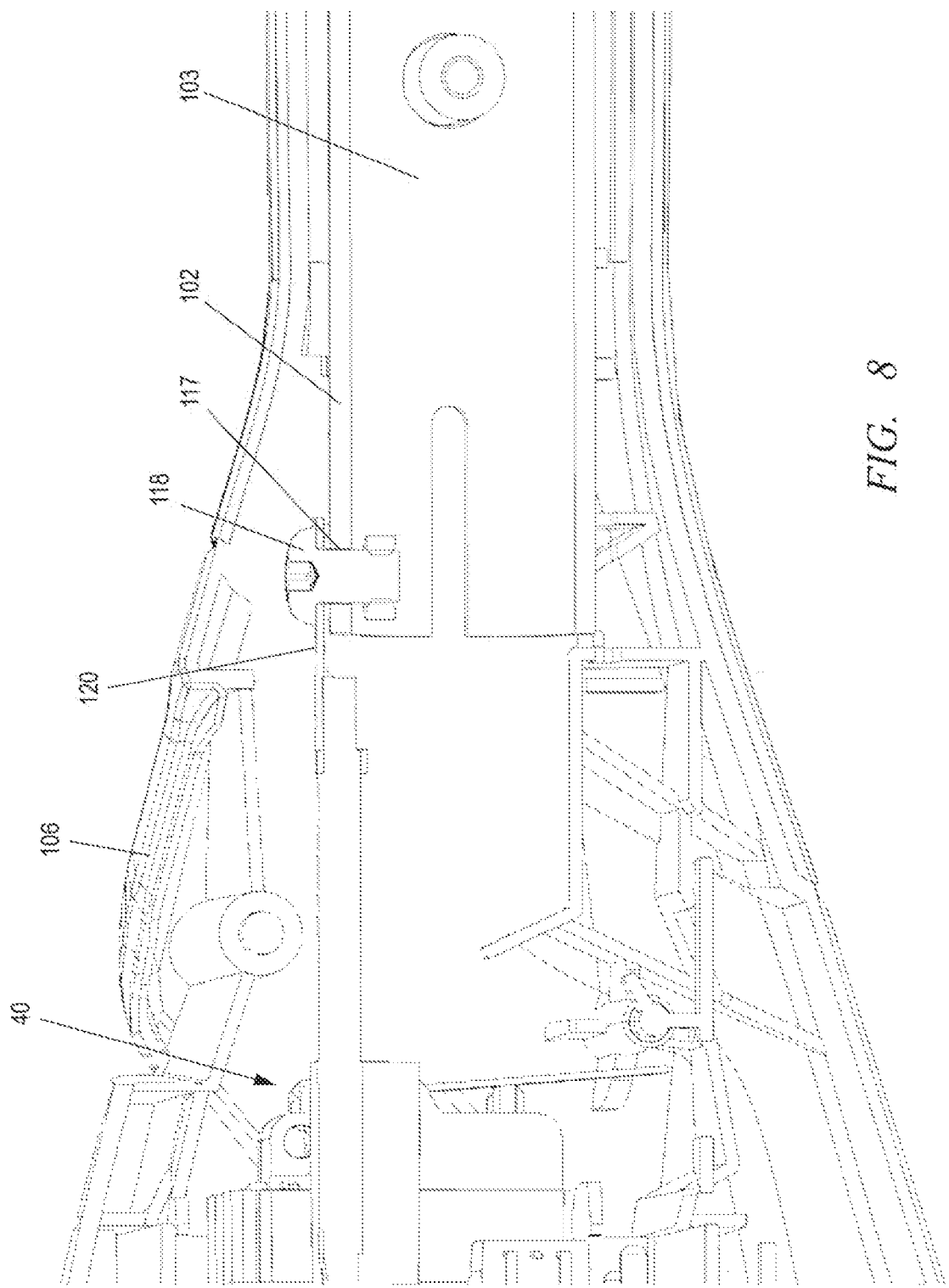

A partial section through the receptacle housing 106 with the control electronics 40 arranged therein is shown in FIG. 8. The lower end 102 of the guide tube 103, which is inserted into the receptacle housing 106, has an assembly opening 117 for a clamping screw 118 in the tube wall. An electrical connection formed in particular as a flat cable 120 or an earthing strap is electroconductively fixed to the tube wall of the guide tube 103 via the clamping screw 118. The guide tube 103 is electroconductively connected to a potential of the supply voltage, in particular to the negative pole of the supply voltage, via the flat cable 120. A significant reduction in the electromagnetic interference radiation can thus be achieved.

It is understood that the foregoing description is that of the preferred embodiments of the invention and that various changes and modifications may be made thereto without departing from the spirit and scope of the invention as defined in the appended claims.

What is claimed is:

1. A filter circuit on an electric motor, wherein the electric motor has a rotor and further has connections for electrical connection of the electric motor to a supply voltage, wherein the connections of the electric motor are provided on a connection end of the electric motor, the filter circuit comprising:
    a capacitor bridge arranged between the electrical connections of the electric motor;
    wherein the filter circuit is arranged on a circuit board;
    wherein the circuit board with the filter circuit is held on the connection end of the electric motor;
    said capacitor bridge having a first interference suppression capacitor and a second interference suppression capacitor;
    said capacitor bridge forming a conductor branch;
    said first interference suppression capacitor and said second interference suppression capacitor being electrically connected in series in said conductor branch;
    said first interference suppression capacitor of said capacitor bridge having first electrical connections and defining a first longitudinal axis extending between said first electrical connections;
    said second interference suppression capacitor of said capacitor bridge having second electrical connections and defining a second longitudinal axis extending between said second electrical connections; and,
    said first interference suppression capacitor of said capacitor bridge and said second interference suppression capacitor of said capacitor bridge being arranged on the circuit board such that said first longitudinal axis and said second longitudinal axis are aligned in different spatial directions (x,Y).

2. The filter circuit of claim 1, wherein said capacitor bridge is a first capacitor bridge and said conductor branch is a first conductor branch, the filter circuit further comprising:
    a second capacitor bridge forming a second conductor branch; and,
    wherein said second conductor branch and said first conductor branch lie electrically parallel to one another.

3. The filter circuit of claim 2, wherein:
    said second conductor branch includes a third interference suppression capacitor defining a third longitudinal axis and a fourth interference suppression capacitor defining a fourth longitudinal axis;
    said third interference suppression capacitor and said fourth interference suppression capacitor being arranged on the circuit board such that said third longitudinal axis and said fourth longitudinal axis are aligned in different spatial directions (x,y); and, said first interference suppression capacitor and said third interference suppression capacitor are mechanically held on the circuit board such that said first longitudinal axis and said third longitudinal axis lie parallel to each other.

4. The filter circuit of claim 1, wherein said first interference suppression capacitor and said second interference suppression capacitor are mechanically mounted on the circuit board so as to lie on a common virtual mounting circle; and, said first longitudinal axis and said second longitudinal axis each form a tangent to said mounting circle.

5. The filter circuit of claim 4, wherein the rotor of the electric motor defines a rotation axis and said mounting circle extends around the rotation axis of the rotor.

6. The filter circuit of claim 4, wherein said first interference suppression capacitor and said second interference suppression capacitor are arranged on the circuit board at equal spatial distances (z) in a circumferential direction of said mounting circle.

7. The filter circuit of claim 1, wherein said first interference suppression capacitor and said second interference suppression capacitor have the same electrical value.

8. The filter circuit of claim 3, wherein said first interference suppression capacitor and said second interference suppression capacitor have the same electrical value; and, said third interference suppression capacitor and said fourth interference suppression capacitor have the same electrical value.

9. The filter circuit of claim 1 further comprising a choke connected in an electrical supply line between the supply voltage and the electric motor, wherein the capacitor bridge is electrically connected between said choke and one of the connections of the electric motor.

10. The filter circuit of claim 9, wherein said choke is a rod core choke.

11. The filter circuit of claim 9, wherein said choke is mechanically held on the circuit board of the filter circuit.

12. The filter circuit of claim 9, wherein said choke has a winding axis extending in a longitudinal direction, wherein said winding axis is aligned radially with respect to a virtual mounting circle of said first interference suppression capacitor and said second interference suppression capacitor.

13. The filter circuit of claim 9 further comprising:

a further choke having a further winding defining a further winding axis;

said further choke being arranged in a positive path of the electrical supply line;

said choke being arranged in a negative path of the electrical supply line; and, said choke and said further choke being arranged such that said winding axis and said further winding axis are coaxial.

14. The filter circuit of claim 1, wherein the electric motor is a direct current motor configured to drive a tool; the tool is arranged at a first end of a guide tube made of an electrically conductive material; the supply voltage is fed to the electric motor from a second end of the guide tube via a power cable installed in the guide tube; and, the guide tube is electroconductively connected to a potential of the supply voltage.

15. The filter circuit of claim 14, wherein the guide tube is electroconductively connected to a negative pole of the supply voltage at the second end.

16. The filter circuit of claim 14, wherein the supply voltage is provided by control electronics for the electric motor; and, the control electronics are arranged at the other end of the guide tube.

\* \* \* \* \*